United States Patent
Shanker et al.

(10) Patent No.: US 6,906,544 B1
(45) Date of Patent: Jun. 14, 2005

(54) METHODS AND APPARATUS FOR TESTING A CIRCUIT BOARD USING A SURFACE MOUNTABLE ADAPTOR

(75) Inventors: Bangalore J. Shanker, Fremont, CA (US); Suryaprakash Jonnavithula, Santa Clara, CA (US); Ashwath Nagaraj, Los Altos, CA (US); Wheling Cheng, Palo Alto, CA (US)

(73) Assignee: Cisco Technology, Inc., San Jose, CA (US)

( * ) Notice: Subject to any disclaimer, the term of this patent is extended or adjusted under 35 U.S.C. 154(b) by 33 days.

(21) Appl. No.: 10/367,456

(22) Filed: Feb. 14, 2003

(51) Int. Cl.[7] .............................................. G01R 31/00
(52) U.S. Cl. .................................... 324/762; 324/158.1
(58) Field of Search .............................. 324/754–762, 324/73.1, 158.1; 439/61–90

(56) References Cited

U.S. PATENT DOCUMENTS 4,922,191 A * 5/1990 Conover ..................... 324/755
5,793,218 A * 8/1998 Oster et al. ................. 324/754

OTHER PUBLICATIONS

Emulation Technology 0.75mm Pitch Logic Analyzer Probe Adapter Fits Tight Designs, Newest Bug Katcher ™ Supports Intel® 1.8 Volt Wireless Flash Memory (W18/W30), http://www.emulation.com/whatsnew/press/090302.html, Visited Jan. 23, 2003.

Decoupling in Digital Circuits, Elecktor, Nov. 1983.

Agilent Technologies, "E5346–60002 High–Speed Michtor Adapter Installation Note", Printed Jun. 2000.

* cited by examiner

Primary Examiner—Vinh P. Nguyen
(74) Attorney, Agent, or Firm—Chapin & Huang, L.L.C.; David E. Huang, Esq.

(57) ABSTRACT

A surface mount adaptor allows for removable attachment of debugging connectors to a circuit board and provides high density access to the circuit board under test at a single location. A circuit board testing assembly has a support member having debugging connectors coupled to a first surface of the support member, the debugging connectors being configured to attach to a circuit board testing device. The circuit board testing assembly also has a support member connector coupled to a second surface of the support member and in electrical communication with the debugging connectors. The support member is configured to removably attach to a circuit board connector surface mounted to a first surface of a circuit board. Removable attachment of the debugging connectors from the circuit board provides an availability of space on the top side of the circuit board for additional circuit board components and traces.

27 Claims, 7 Drawing Sheets

METHODS AND APPARATUS FOR TESTING A CIRCUIT BOARD USING A SURFACE MOUNTABLE ADAPTOR

BACKGROUND OF THE INVENTION

A typical circuit board is formed of circuit board material (e.g., fiberglass, copper, vias, etc.) and circuit board components attached or mounted to the circuit board material. Circuit board manufacturers conventionally test the operability of (e.g., debug) a manufactured circuit board prior to high volume manufacturing and shipping of the circuit board to an end user.

One conventional circuit board testing device is a bed of nails testing device. A typical bed of nails testing device includes a relatively heavy and large support plate and a holder having spring-loaded pins configured to make electrical contact with a circuit board during testing. During operation, for example, a user places the circuit board onto the support plate of the bed of nails testing device. The user then activates the testing device, thereby causing the support plate to lift and press the circuit board against the spring loaded test pins of the holder. The test pins contact the circuit board, thereby allowing the testing device to test the continuity of board (e.g., alignment of printed circuit board layers or continuity in etching of the traces of printed circuit board).

When using bed of nails to test circuit boards having components mounted using Surface Mount Technology (SMT), the circuit board includes test pads, conventionally between 0.015 to 0.040 inches in diameter as a contact interface for the test pins. Such test pads minimize damage caused by the test pins to the leads of the circuit board components.

Another conventional testing device includes a logic analyzer that connects to a circuit board for in-circuit testing and debugging of input/output (I/O) components on the circuit board. Typically, circuit boards include debugging connectors or probes, such as MICTOR connectors (MICTOR is a trademark of Tyco International, Ltd.), mounted on the top side (e.g., component side) of the circuit board (e.g., motherboard). Cables connect the debugging connectors to the logic analyzer, thereby allowing testing and debugging of the circuit board and I/O components.

SUMMARY

Conventional testing devices and techniques for testing a circuit board suffer from a variety of deficiencies.

Regarding the bed of nails device, as described above, during operation a user places a circuit board onto the support plate of the bed of nails testing device. Upon activation of the device, test pins contact the circuit board and allow the testing device to test the continuity of board. In certain cases, however, the circuit board forms part of a computer system having multiple circuit boards. Such conventional computer systems have a card cage or chassis that holds the circuit boards and a back plane, mounted to the card cage, configured to provide connection of the circuit boards to the computer system. Proper testing or debugging of a circuit board in such a computer system can require the relationship among all of the circuit boards be maintained during the testing procedure (e.g., a user performs testing of a particular circuit board while the circuit board is located within the card cage and connected to the back plane). Because the bed of nails tester requires the circuit board to be removed from its operating environment, the use of the bed of nails device for the circuit board described is impractical.

Also, as described above, the bed of nails tester is relatively large and heavy. The size and weight of the bed of nails tester limits the practicality or the possibility for an operator to test a circuit board in its normal operating environment and under normal operating conditions (e.g., mounted within a card cage with neighboring circuit boards). For example, in the case of the computer system having multiple circuit boards, the conventional card cage limits the distance or space (e.g., slot) between adjacent circuit boards. Conventional bed of nails testers are relatively large and are not configured to fit within the slot between adjacent circuit boards.

Also regarding the bed of nails testers, as described above, test circuit boards having components mounted using Surface Mount Technology (SMT), the circuit board includes test pads, conventionally between 0.015 to 0.040 inches in diameter as a contact interface for the test pins. Such test pads, however, occupy real estate on the circuit board that can otherwise be available to mount other active components. The use of the bed of nails tester to test a circuit board having multiple circuit board components, therefore, can limit the amount of usable circuit board real estate.

Regarding the logic analyzer, as described above, the logic analyzer connects to debugging connectors, conventionally mounted on the top side (e.g., component side) a circuit board, for in-circuit testing and debugging of input/output (I/O) components on the circuit board. As the performance for circuit board and networking products increases, the packaging density of circuit board components also increases. Real estate (e.g., available space) on the top side (e.g., component side) of printed circuit boards, therefore, is limited. The debugging connectors occupy real estate on the top side of the circuit board that can otherwise be available to mount other active components to increase system performance. Mounting of debugging connectors to the top side a circuit board circuit, therefore, can limit the performance of the circuit board.

To minimize the amount of real estate occupied by the debugging connectors on the top side of the circuit board, a manufacturer could mount the debugging connectors to the bottom side (e.g., solder side) of the circuit board to provide a greater amount of real estate on the top side of the circuit board for attachment of additional active components. Many debugging connector designs, however, have a through-hole requirement, which takes away routing space in the inner layers of the printed circuit board and also utilizes real estate on the top side of the circuit board. For a manufacturer to relocate the debugging connectors from the top side to the bottom side of the circuit board, therefore, still minimizes real estate available for either routing or mounting of additional circuit board components to the top side a circuit board circuit.

Additionally, real estate available for debugging connectors decreases as the size of the circuit board decreases. For example, in circuit boards known as Shared Port Adapters (SPA), as manufactured by Cisco Systems, of San Jose, Calif., the SPA boards are relatively small, having dimensions of approximately 5.6 inches by 6 inches, compared to conventional circuit boards, having dimensions of approximately 14 inches by 16 inches. Current SPA designs utilizing a 1517 I/O field programmable gate array (FPGA) require at least 26 individual debugging connectors. Typical debugging connectors, such as MICTOR connectors, occupy an area of approximately 0.4 square inches (e.g., MICTOR connectors having a circuit board contact dimensions of approximately 1.2 inches by 0.3 inches). The use of 26 debugging connectors on the top surface of the SPA utilizes almost one-third of the available surface area of the SPA board. For relatively small circuit boards, therefore, mounting debugging connectors to the top surface of the SPA minimizes real estate available for mounting the circuit board components to the SPA.

Also, with respect to the use of debugging connectors with the circuit board, conventionally, manufacturers mount the debugging connectors to every circuit board manufactured and shipped. While such a configuration provides a user with the ability to test the circuit board after shipment, the debugging connectors add to cost of manufacture for each circuit board.

By contrast to the use of prior debugging connectors, embodiments of the present invention significantly overcome such deficiencies and provide a method and apparatus for testing a circuit board using a surface mount adaptor that allows for removable attachment of debugging connectors to the circuit board and provides high density access to the circuit board under test at a single location. Such removable attachment of the debugging connectors provides an availability of space on the top side of the circuit board for additional circuit board components and traces. Also, removable attachment of debugging connectors to the circuit board decreases manufacturing costs associated with the circuit board since the debugging connectors are useable to test and debug multiple circuit boards. Surface mounting the adaptor to the circuit board also minimizes the necessity for using through-holes or support plates to secure the adaptor to the circuit board.

In one arrangement, a circuit board testing assembly has a support member having a first surface and a second surface and at least one debugging connector coupled to the first surface of the support member where the at least one debugging connector is configured to attach to a circuit board testing device. The circuit board testing assembly also has a support member connector coupled to the second surface of the support member and in electrical communication with the at least one debugging connector. The support member is configured to removably attach to a circuit board connector surface mounted to a first surface of a circuit board. The support member connector, the circuit board connector and the debugging connector are configured to provide a set of electrical connections from the circuit board to the testing device when support member connector connects with the circuit board connector and the debugging connector connects with the testing device. Removable attachment of the debugging connectors to the circuit board provides an availability of space on the top side of the circuit board for additional circuit board components and traces, thereby allowing for an increase in the performance of the circuit board.

In one arrangement, the testing assembly has an alignment mechanism having a first alignment portion associated with the support member connector and a second alignment portion associated with the circuit board connector. In another arrangement, the alignment mechanism has a first alignment portion associated with the support member and a second alignment portion associated with the circuit board. The alignment mechanism is configured to align the support member connector with the circuit board connector during an attachment procedure. The alignment mechanism minimizes misalignment between the support member connector (e.g., having a pin array) and the circuit board connector (e.g., defining a sockets array). Such misalignment can lead to improper testing of the circuit board or circuit board component.

In one arrangement, the support member connector defines an opening configured to allow connection of a decoupling capacitor to the support member. The opening allows connection of the decoupling capacitor without requiring the user to remove the support member connector from the support member.

In one arrangement, the support member connector has a pin base having a plurality of pins and the circuit board connector has a socket base defining a plurality of sockets where the plurality of sockets corresponds to the plurality of pins. The use of a pin base and socket base combination allows removable connection of the debugging connectors to high-density circuit board components.

In one arrangement, the support member connector is a high density connector providing multiple electrical connection locations between the debugging connector and the circuit board. In one arrangement, the circuit board connector is a high density connector providing multiple electrical connection locations between the debugging connector and the circuit board. The high density connectors provide an interface between high density circuit board components, such as microprocessors, and debugging connectors.

In one arrangement, the support member connector is a surface mountable support member connector and the support member is a circuit board material. In such an arrangement, the surface mountable support member connector surface mounts to the support member. Surface mounting the surface mountable support member connector to the support member minimizes the necessity for using through-holes or support plates to secure the surface mountable support member connector to the support member.

Another embodiment of the invention relates to a circuit board assembly. The circuit board assembly has a circuit board having a first surface and a second surface, a circuit board connector surface mounted to the first surface of the circuit board, and a circuit board component coupled to the second surface of the circuit board and in electrical communication with the circuit board connector. The circuit board assembly further includes the circuit board testing assembly as described above. Surface mounting the circuit board connector to the circuit board minimizes the necessity for using through holes or support plates to secure the circuit board connector to the circuit board. The circuit board connector, furthermore, allows for removable attachment of the debugging connectors to the circuit board, thereby provides an increase in the availability of real estate on the circuit board for inclusion of additional circuit board components and traces to increase the performance of the circuit board.

Another embodiment of the invention relates to a circuit board testing assembly having a support member having a first surface and a second surface, at least one debugging connector coupled to the first surface of the support member where the at least one debugging connector is configured to attach to a circuit board testing device, a circuit board component coupled to the first surface of the support member and in electrical communication with the at least one debugging connector, and a support member connector coupled to the second surface of the support member and in electrical communication with the at least one debugging connector. The support member is configured to removably attach to a circuit board connector mounted to a first surface of a circuit board. The support member connector, the circuit board connector and the debugging connector are configured to provide a set of electrical connections from the circuit board to the testing device when support member connector connects with the circuit board connector and the debugging connector connects with the testing device. Removable attachment of the debugging connectors to the circuit board provides an availability of space on the top side of the circuit board for additional circuit board components and traces, thereby allowing for an increase in the performance of the circuit board.

The features of the invention, as described above, may be employed in electronic equipment and methods such as those of Cisco Systems of San Jose, Calif.

BRIEF DESCRIPTION OF THE DRAWINGS

The foregoing and other objects, features and advantages of the invention will be apparent from the following more particular description of embodiments of the invention, as illustrated in the accompanying drawings and figures in which like reference characters refer to the same parts throughout the different views. The drawings are not necessarily to scale, with emphasis instead being placed upon illustrating the embodiments, principles and concepts of the invention.

DETAILED DESCRIPTION

Embodiments of the present invention provide a method and apparatus for testing a circuit board using a surface mount adaptor, the surface mount adaptor allowing for removable attachment of debugging connectors to the circuit board and providing high density access to the circuit board under test at a single location. Such removable attachment of the debugging connectors provides an availability of space on the top side of the circuit board for additional circuit board components and traces. Also, removable attachment of debugging connectors to the circuit board decreases manufacturing costs associated with the circuit board since the debugging connectors are useable to test and debug multiple circuit boards. Surface mounting the adaptor to the circuit board also minimizes the necessity for using throughholes or support plates to secure the adaptor to the circuit board.

Figure 1:
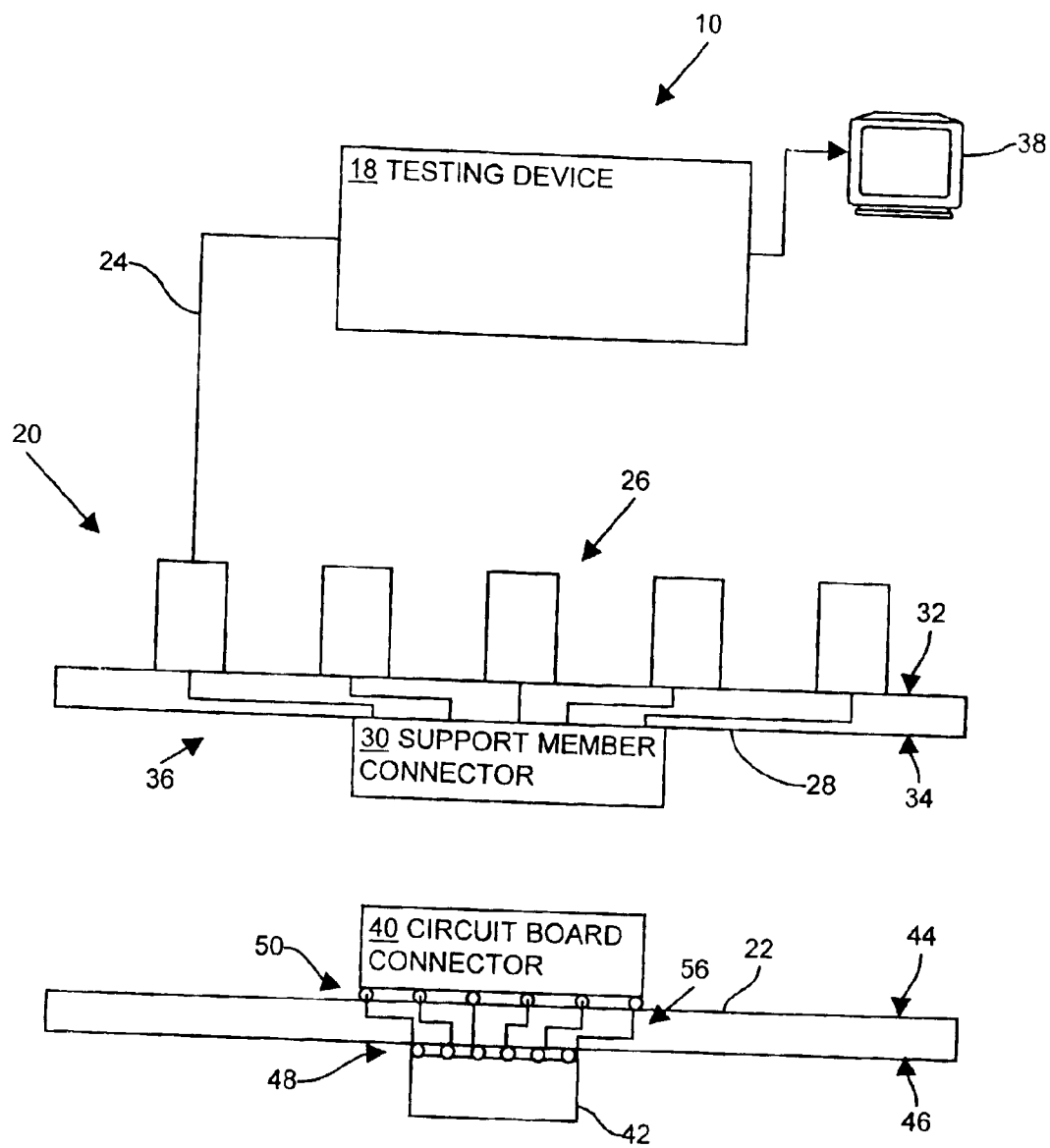
FIG. 1 is a block diagram of a circuit board testing system that is suitable for use of the invention.

FIG. 1 illustrates a circuit board testing system 10. In the arrangement shown, the testing system 10 includes a testing device 18, a circuit board testing assembly 20, and a circuit board 22 under test.

The testing apparatus 18, such as a logic analyzer, connects to the circuit board 22 for debugging or testing the circuit board 22 as a whole or individual circuit board components 42 associated with the circuit board 22. The testing device 18 attaches to an output device 38, such as a monitor. During a circuit board debugging procedure, the output device 38 allows a user or operator to view the data or results of the circuit board testing.

The circuit board testing assembly 20 acts as an interface between the testing device 18 and the circuit board 22 and allows removable attachment of debugging connectors 26 from the circuit board 22. Furthermore, the circuit board testing assembly 20 allows testing of the circuit board 22 within the operating environment of the circuit board 22 and under conventional operating conditions (e.g., mounted within a card cage with neighboring circuit boards) as opposed to the use of a bed of nails testing device. As illustrated, the circuit board testing assembly 20 has a support member 28, a support member connector 30, and debugging connectors 26.

The support member 28, in one arrangement, is formed of circuit board material (e.g., fiberglass, copper, vias, etc.) having a first surface 32 and an opposing second surface 34. The support member 28 allows a manufacturer to provide traces or electrical connections 36 between the support member connector 30, such as a high density support member, and the debugging connectors 26. The debugging connectors 26 couple to the first surface 32 of the support member 28 while the support member connector 30 couples to the second surface 34 of the support member 28. In one arrangement, the support member connector is a surface mountable component that surface mounts to the support member 28. The support member 28 provides electrical communication between the debugging connectors 26 and the support member connector 30. For example, the support member 28 is configured with electrical traces that connect each of the debugging connectors 26 to corresponding contacts (e.g., ball grid array of the surface mountable support member connector 30) on the support member connector 30.

The debugging connectors 26, such as MICTOR connectors, are configured to attach to the testing device 18 through a testing device connector 24, such as a probe and cable combination. Because the debugging connectors 26 mount to the circuit board testing assembly 20, as opposed to the debugging connectors 26 conventionally mounting directly to the circuit board 22, a circuit board tester can reuse the debugging connectors 26 for testing multiple circuit boards 22, thereby decreasing the manufacturing cost of the circuit board 22.

The support member connector 30, as described above, couples to the second surface 34 of the support member 28 and is in electrical communication with the debugging connectors 26. For example, the support member connector 30 is formed of a fiberglass material, such as FR-4, having pins that provide electrical communication between the circuit board connector 40 and the debugging connectors 26.

The support member connector 30, in one arrangement, is configured to engage a circuit board connector 40 associated with the circuit board 22, thereby allowing coupling of the circuit board testing assembly 20 with the circuit board 22. In one arrangement, the support member connector 30 secures to the support member 28 using surface mount technology, such as a ball grid array having a plurality of solder balls.

In one arrangement, the support member connector 30 is a high pin count or high density connector providing multiple electrical connection points or locations between the debugging connectors 26 and the circuit board 22. The support member connector 30, for example, is a pin base having a pin array 52, such as the pin array 52 illustrated in FIG. 3. In one arrangement, the pin array 52 includes, for example, approximately 1500 individual pins that engage the circuit board connector 40 of the circuit board 22.

Returning to FIG. 1, the circuit board 22 includes the circuit board connector 40 and a circuit board component 42. The circuit board 22, in one arrangement, is formed of circuit board material (e.g., fiberglass, copper, vias, etc.) having a first surface 44 and an opposing second surface 46. The circuit board connector 40 couples to the first surface 44 of the circuit board 22 while the circuit board component 42 couples to the second surface 46 of the circuit board 22. The circuit board 22 provides electrical communication (e.g., electrical connections 56) between the circuit board connector 40 and the circuit board component 42. For example, the circuit board 22 is configured with electrical traces 56 that connect each testing or debugging output of the circuit board component 42 to corresponding contacts on the circuit board connector 40.

In one arrangement, the circuit board connector 40 secures to the circuit board 22 using surface mount technology (SMT), such as a ball grid array. Mounting the circuit board connector 40 to the circuit board 22 using SMT minimizes the necessity for adding through-holes or support plates to secure the circuit board connector 40 to the circuit board 22.

Figure 4:
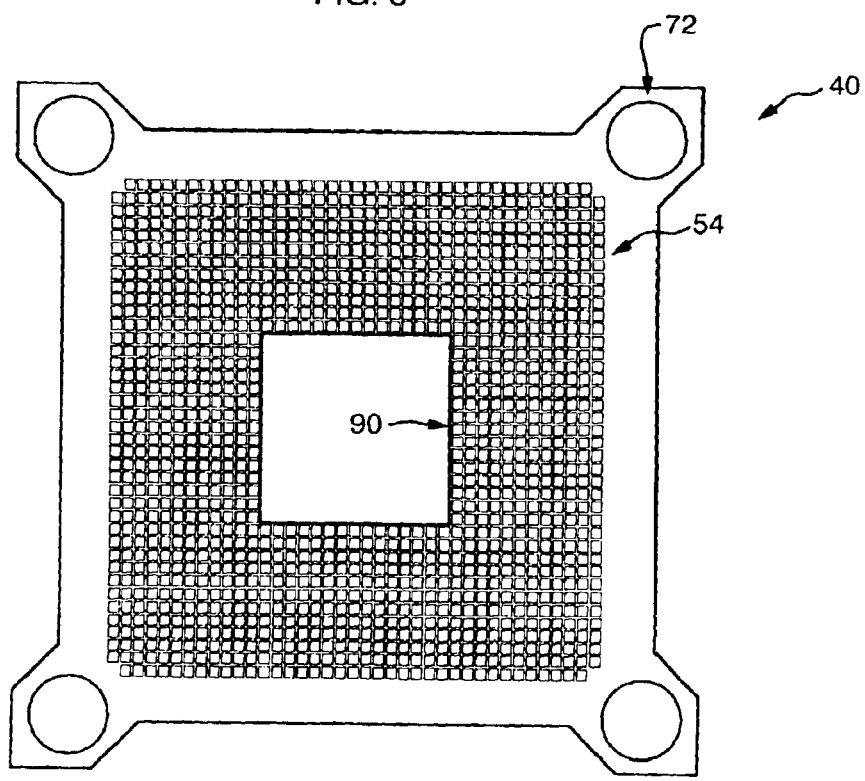
FIG. 4 illustrates a block diagram of a circuit board connector, according to one embodiment.

In one arrangement, the circuit board connector 40 is a high density connector providing multiple electrical connection points or locations between the debugging connectors 26 and the circuit board 22. The circuit board connector 40, in one arrangement, is a socket base formed of a fiberglass material, such as FR-4, that defines a plurality of sockets or a socket array 54, as illustrated in FIG. 4. The socket array 54 of the socket base 40 corresponds to and is configured to accept (e.g., couple with) the pin array 52 of the pin base assembly 30. For example, the socket array 54 includes, for example, approximately 1500 individual sockets configured to accept the corresponding pin array 52 of the support member connector 30. Use of a single circuit board connector 40 with the circuit board 22, as opposed to mounting multiple MICTOR connectors to the circuit board 22, reduced the cost for manufacturing the circuit board 22.

Returning to FIG. 1, the circuit board component 42, for example, is a microprocessor, an application-specific integrated circuit (ASIC) or is a field programmable gate array (FPGA). In one arrangement, connection between the circuit board testing assembly 20 and the circuit board connector 40 allows a user to test the operation of the circuit board component 42 (e.g., debugging of the circuit board component 42). For example, each testing or debugging output of the circuit board component 42 connects with (e.g., electrically communicates with) corresponding contacts on the circuit board connector 40.

In one arrangement, when the circuit board 22 provides electrical communication between the circuit board connector 40 and the circuit board component 42, the circuit board connector 40 mounts to the first surface 44 of the circuit board directly opposing (e.g., directly below) the circuit board component 42. During assembly of the circuit board 22, the second surface 46 (e.g., component side) of the circuit board 22 is configured with plurality of pads and vias, where the vias extend from the second surface 46 to the first surface 44 of the circuit board 22. The circuit board component 42 secures to the pads of the second surface 46 of the circuit board 22 using surface mount technology (e.g., solder ball grid array) to form a circuit board component solder joint 48. The circuit board connector 40, in one arrangement, secures to pads on the first surface 44 of the circuit board 22, the pads electrically connected to the corresponding vias on the first surface 44 of the circuit board 22. The circuit board connector 40 secures to the first surface 44 of the circuit board 22 using surface mount technology (SMT) that forms a circuit board connector solder joint 50. Mounting the circuit board connector 40 to the circuit board 22 directly opposing (e.g., directly below) the circuit board component 42 minimizes the need to create additional traces and vias on the second surface 46 of the circuit board 22 to connect the circuit board connector 40 and the circuit board component 42, thereby minimizing the parasitic of the interconnect (e.g., minimizing the performance loss of the interconnect).

When a user couples the support member connector 30 to the circuit board connector 40, the support member connector 30, the circuit board connector 40 and the debugging connector 26 provide a set of electrical connections from the circuit board 22 to the testing device 18 when debugging connectors 26 connect with the testing device 18. For example, after the user attaches the circuit board testing assembly 20 to the circuit board 22 (e.g., through the circuit board connector 40) the user connects the connector 24 to the testing device or logic analyzer 18, thereby allowing signals to travel between the circuit board 22 and the testing device 18 to debug the circuit board component 42.

Figure 2:
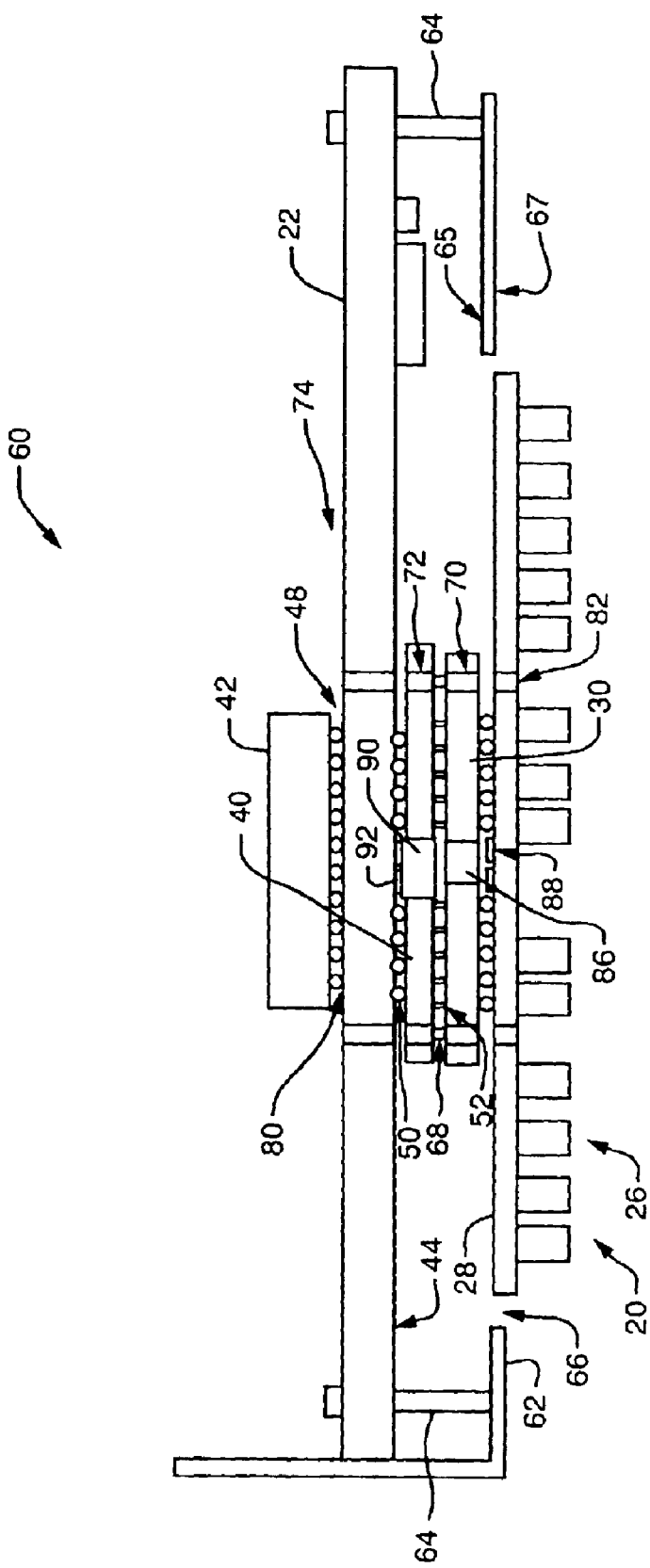
FIG. 2 illustrates a side view of a circuit board assembly, according to one embodiment.

FIG. 2 illustrates a circuit board assembly 60 configured to insert into a computer system having a card cage and a back plane. The circuit board assembly 60 is further configured to connect to the back plane, thereby allowing operation of the circuit board assembly 60 in conjunction with other circuit board assemblies connected to the back plane. The circuit board assembly 60, as illustrated, shows the circuit board testing assembly 20 in electrical communication with the circuit board 22 during testing of the circuit board 22.

In one arrangement, the circuit board assembly 60 includes a support mount 62 that essentially operates as a carrier (e.g., carrier tray) for holding the circuit board 22 in place for proper alignment and connection with a back plane of a computer system. In one arrangement, the support mount 62 is coupled to the circuit board 22 using side portions or standoffs 64 and is substantially parallel to the circuit board 22. The support mount 62 has a first surface 65 and a second surface 67, the first surface 44 of the circuit board 22 and first surface 65 of the support mount 62 defining a space between the circuit board 22 and support mount 65. As shown, the support mount 62 further defines an opening 66 that allows the support member connector 30 of the circuit board testing assembly 20 to connect with the circuit board connector 40 of the circuit board 22 during circuit board testing. In one configuration, after testing, an operator removes the support mount 62 defining the opening 66 from the circuit board 22 and replaces the support mount with a solid support mount 110 (e.g., the support mount 110 not defining an opening to allow the support member connector 30 of the circuit board testing assembly 20 to connect with the circuit board connector 40). Such a support mount 110 provides electromagnetic interference (EMI) shielding to the circuit board 22 during conventional operation.

In one arrangement, use of the opening 66 allows a user to insert the circuit board assembly 60 (e.g. the circuit board testing assembly 20, circuit board 22, and support mount 62) into a card cage and attach the circuit board to a back plane. In such configuration, the combination of the support mount opening 66, along with the relatively low profile of the circuit board testing assembly 20 (e.g., the relatively small distance between the coupling face of the support member connector 30 and the debugging connectors 26) allows the user to test the circuit board 22 after circuit board 22 connects to the back plane of a computer system and while the circuit board interacts with other circuit boards connected to the back plane. Therefore, in such a configuration, the user tests the circuit board 22 while the circuit board 22 operates within a native operating environment.

In one arrangement, the circuit board testing assembly 20 has an alignment mechanism 68 that is configured to align the support member connector 30 with the circuit board connector 40 during an attachment procedure (e.g., when a user couples the circuit board testing assembly 20 to the circuit board 22). For example, during an attachment procedure, when the support member connector 30 attaches to the circuit board connector 40, the alignment mechanisms 68 aligns the connectors 30, 40 to allow proper testing of the circuit board 22 and circuit board component 42. For example, as described above, assume the case where the support member connector 30 has a pin array 52 formed of approximately 1500 individual pins and where the circuit board connector 40 has a sockets array 54, defined by the circuit board connector, having approximately 1500 sockets corresponding to the pins of the pin array 52. The alignment mechanism 68 provides for proper alignment of the pin array 52 and the socket array 54 such that pin 1 of the pin array 52 aligns with socket 1 of the socket array 54, pin 2 aligns with socket 2, etc. The alignment mechanism 68 minimizes misalignment between the pin array 52 and the sockets array 56. Such misalignment can lead to pin damage and improper testing of the circuit board 22 or circuit board component 42.

Figure 3:
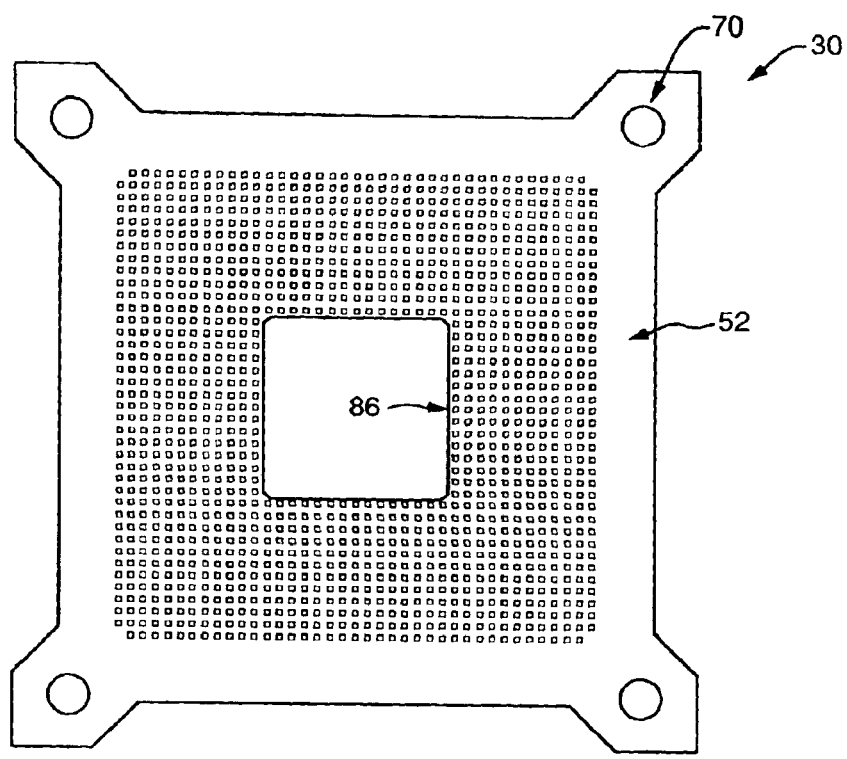
FIG. 3 illustrates a block diagram of a support member connector, according to one embodiment.

In one arrangement, the alignment mechanism 68 includes a first alignment portion 70 associated with the support member connector 30 and a second alignment portion 72 associated with the circuit board connector 40. For example, as shown by FIGS. 2, 3, and 4 in one arrangement, the first alignment portion 70 includes a shaft or protrusion coupled to the support member connector 30 and the second alignment portion 72 defines an opening within the circuit board connector 40 corresponding to the protrusion 70 of the support member connector 30. Correspondence of the protrusion 70 and the opening 72 aligns the pin array 52 of the support member connector 30 with the socket array 54 of the circuit board connector 40. In such an arrangement, the protrusion 70 from the support member connector 30 engages or couples with the opening 72 defined by the circuit board connector 40, thereby providing alignment between the pin array 52 and the socket array 54.

As described, the alignment mechanism 68 has the first alignment portion 70 associated with the support member connector 30 and the second alignment portion 72 associated with the circuit board connector 40. Alternately, the support member 28 of the circuit board testing assembly 20 and the circuit board 22 aids in alignment between the support member connector 30 and the circuit board connector 40. For example, as illustrated in FIG. 2, the circuit board 22 defines circuit board alignment openings 80 while the support member 28 defines support member alignment openings 82. The protrusion portion 70 of the circuit board testing assembly 20 extends through the opening 72 defined by circuit board connector 40 and inserts within the circuit board alignment openings 80. Furthermore, the protrusion portion 70 of the circuit board testing assembly 20 engages the support member alignment openings 82. Such engagement provides further alignment of the support member connector 30 relative to the circuit board connector 40.

Also as illustrated by FIGS. 2, 3, and 4, in one arrangement, the support member connector 30 defines an opening 86 that allows the user to install decoupling capacitors 88 to the circuit board testing assembly 20. Also as shown, the circuit board connector 40 defines an opening 90 that allows the user to install decoupling capacitors 92 to the circuit board 22.

In digital circuits, during operation of the circuit board component 42, the current passing through the circuit board component 42 and the associated traces changes relatively quickly. As a consequence, the voltage in the traces can vary by relatively large amount, as caused by inductance of the current supply line. Such changes in the voltage, relative to the circuit board component 42, can produce a voltage beyond the limit of the circuit board component 42, thereby causing the circuit board component 42 to operate improperly. The decoupling capacitor 88 connects across the circuit board component 42 (e.g. placed across the power supply pins of the circuit board component) thereby limiting voltage variations in the circuit board component 42.

The support member connector opening 86 and circuit board connector opening 90, therefore, provide a user access to a location on the circuit board testing assembly 20 and the circuit board 22, respectively, to allow connection of the decoupling capacitors 88, 92. Use of the respective openings 86, 90, minimizes the amount of time a user spends in adding decoupling capacitors to either the circuit board testing assembly 20 or the circuit board 22 (e.g., the user does not have to remove the support member connector 30 or the circuit board connector 40 from the circuit board testing assembly 20 or circuit board 22, respectively, to add decoupling capacitors 88, 92).

As illustrated in FIG. 2, the circuit board testing assembly 20 couples to the circuit board connector 40 located on the first surface 44 (e.g., solder surface or circuit board surface facing the support member 64) of the circuit board 22. In certain cases, however, due to space constraints, a user cannot connect the circuit board testing assembly 20 to the solder surface of circuit board 22 in order to test the circuit board 22. In such cases, the circuit board testing assembly 20 and circuit board 22 are alternately configured to provide the circuit board testing assembly 20 access and attachment (e.g., electric coupling) to the circuit board 22 via the component surface (e.g., circuit board surface opposing the support member 64) of the circuit board 22.

Figure 5:
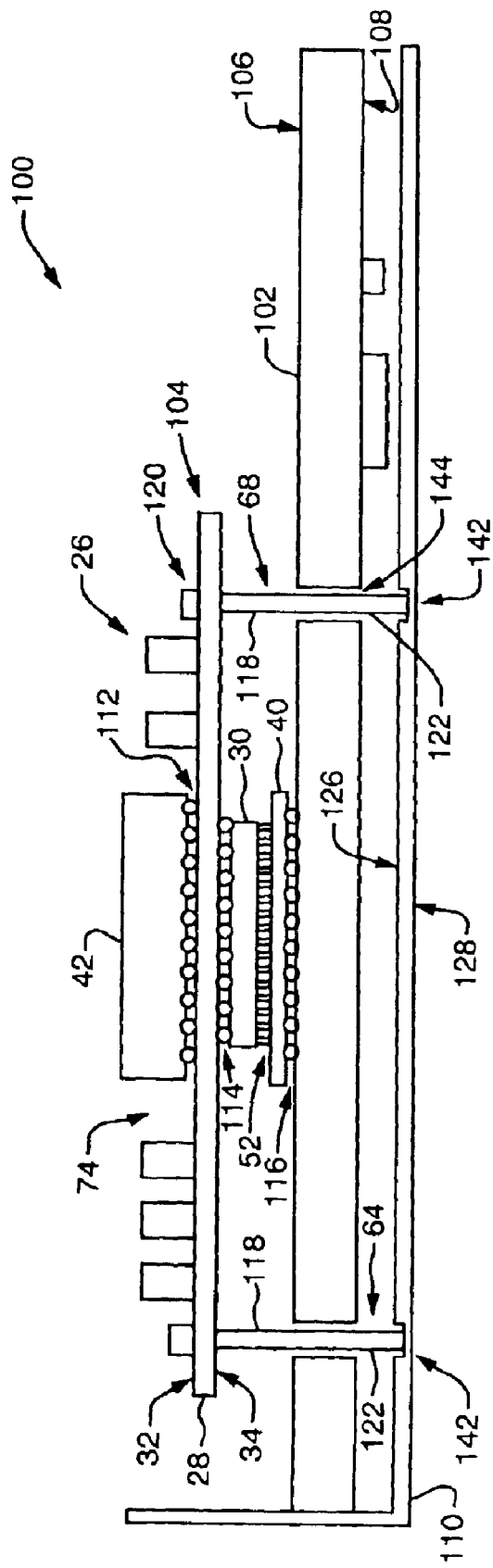
FIG. 5 illustrates a side view of a circuit board assembly, according to another embodiment.

FIG. 5 illustrates an arrangement of a circuit board assembly 100 having a circuit board testing assembly 104 and a circuit board 102 where the circuit board assembly 100 is configured to provide electrical communication between the circuit board testing assembly 104 and the circuit board 102 through a circuit board connector 40 mounted to a first surface 106 (e.g., circuit board surface opposing a support member 110) of the circuit board 102.

The circuit board testing assembly 104 has a support member 28 having a first surface 32 and a second surface 34. Debugging connectors 26 couple to the first surface 32 of the support member 28. A circuit board component 42 also couples to first surface 32 of the support member 28. The support member 28 provides electrical connection or electrical communication between the circuit board component 42 and the debugging connectors 26. The circuit board component 42, in one arrangement, couples to the support member 28 using a surface mount connection 112 (e.g., SMT), such as a ball grid array, that forms a solder joint between the circuit board component 42 and the support member 28. The surface mount connection 112 allows a user to remove the circuit board component 42 from the support member 28 without damaging the circuit board component 42 or the support member 28.

The circuit board testing assembly 104 also has a support member connector 30 coupled to the second surface 34 (e.g., surface opposing the first surface 32) of the support member 28. In one arrangement, the support member connector 30 couples to the second surface 34 through a surface mount connection 114. The surface mount connection 114 secures the support member connector 30 to the second surface 34 of the support member 28 and provides an electrical connection with the debugging connectors 26.

The circuit board 102 includes a circuit board connector 40 coupled to the first surface 106 of the circuit board 102. In one arrangement, the circuit board connector 40 mounts to the circuit board with a surface mount connection and 116. The circuit board connects to a support mount or carrier tray 110 such that the circuit board connector 40 faces in a direction opposing the support mount 110.

When a user couples the support member connector 30 of the circuit board testing assembly 104 to the circuit board connector 40, the support member connector 30, the circuit board connector 40 and the debugging connector 26 provide a set of electrical connections from the circuit board 102 to the testing device 18 when debugging connectors 26 connect with the testing device 18. For example, after the user attaches the circuit board testing assembly 20 to the circuit board 22 (e.g., through the circuit board connector 40) the user connects the connector (e.g., cable) 24 to the testing device or logic analyzer 18, thereby allowing signals to travel between the circuit board 102 and the testing device 18 to debug the circuit board component 42.

FIG. 5 illustrates an arrangement of the alignment mechanism 68 configured to align the support member connector 30 with the circuit board connector 40 during and attachment procedure (e.g. when the user attaches the circuit board testing assembly 104 to the circuit board 102). As illustrated, the alignment mechanism 68 includes a first alignment portion 120 associated with the support member 28 and a second alignment portion 122 associated with the circuit board 102. For example, in one arrangement, the first alignment portion 120 defines a shaft or protrusion 118 coupled to the support member 28 and the second alignment portion 122 defines an opening 144 in the circuit board 102 where the opening 144 is configured to receive the protrusion 118 of the support member 128. Coupling of the first alignment portion 120 with the second alignment portion 122 aligns the support member connector 30 (e.g., pin array 52) with the circuit board connector 40 (e.g., socket array 54).

In another arrangement, the alignment mechanism 68 secures to a support member 110 associated with the circuit board 102 (e.g., the support member 110 aids in alignment between the support member connector 30 and the circuit board connector 40). For example, the support member 110 defines support member receptacles 142 configured to receive the shaft or protrusion 118 from the first alignment portion 120. In such an arrangement, the shaft 114 inserts within, and extends through, the opening 144. In such an arrangement, the first alignment portion 120 is the standoff 64 that connects the support mount 110 to the circuit board 102.

The circuit board assembly 100 illustrated in FIG. 5 allows coupling of the circuit board assembly 104 to the circuit board connector 40 mounted to the first surface 106 (e.g., component surface) of the circuit board 102. Conventionally, the first surface of the circuit board 102 includes circuit board components (e.g., resistors, capacitors, integrated circuits). In certain cases, the circuit board components can be relatively large such that the support member 28 (e.g., the second surface 34 of the support member 28) contacts the circuit board components before the support member connector 30 engages the circuit board connector 40. In such a case, the circuit board components effectively prevent the support member connector 30 from engaging the circuit board connector 40.

Figure 6:
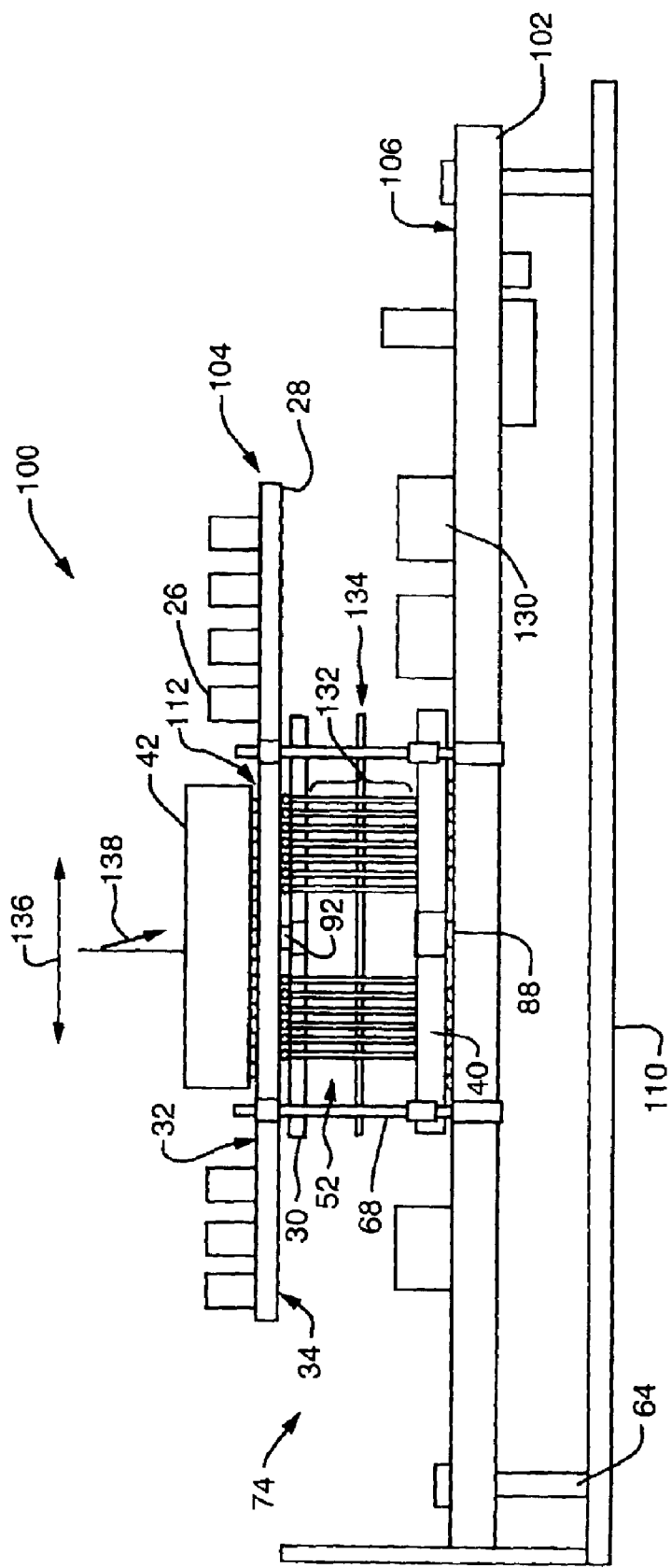
FIG. 6 illustrates a side view of the circuit board assembly of FIG. 5, according to another embodiment.

FIG. 6 illustrates an arrangement of the circuit board assembly 100 where the circuit board testing assembly 104 is configured to allow the support member connector 30 to couple with the circuit board connector 40 in the presence of circuit board components 130, mounted on the first side 106 of the circuit board 102. For example, in such a configuration, as illustrated, the pin array 52 of the support member connector 30 defines a length 132 such that the length 132 of the pin array 52 allow for electrical connection between the support member connector 30 of the circuit board testing assembly 104 and the circuit board connector 40 of the circuit board 102 in the presence of circuit board components 130. In such a case, the length 132 of the pin array 52 limits or prevents the circuit board components 130 from blocking attachment of the support member connector 30 to the circuit board connector 40.

In one arrangement, the support member connector 30 includes a support portion 134 in communication with the pin array 52 of the support member connector 30. By increasing the length 132 of the pin array 52, the manufacturer decreases the bending strength (e.g., the ability to resist a bending force) of the pin array 52 and increases the possibility of occurrence of lateral motion 136 between the support member connector 30 and the circuit board connector 140 during attachment. For example, when a user couples the circuit board testing assembly 104, shown in FIG. 6, to the circuit board 102, application of any non-axial force 138 (e.g., a force not parallel to the long axis of the pin array 52) produces a bending force or bending moment on the pin array 52, thereby causing lateral deformation 136 of the pin array 52 relative to the circuit board testing assembly 104. Such lateral deformation 136 of the pin array 52 can lead to eventual collapse of the pin array 52 during insertion of the support member connector 30 into the circuit board connector 40. The support portion 134 increases the rigidity (e.g., the ability to resist a bending force) of the pin array 52, thereby limiting lateral deformation 136 and limiting the possibility of failure of the pin array 52 or damage to the pin array 52 during an insertion procedure.

Figure 7:
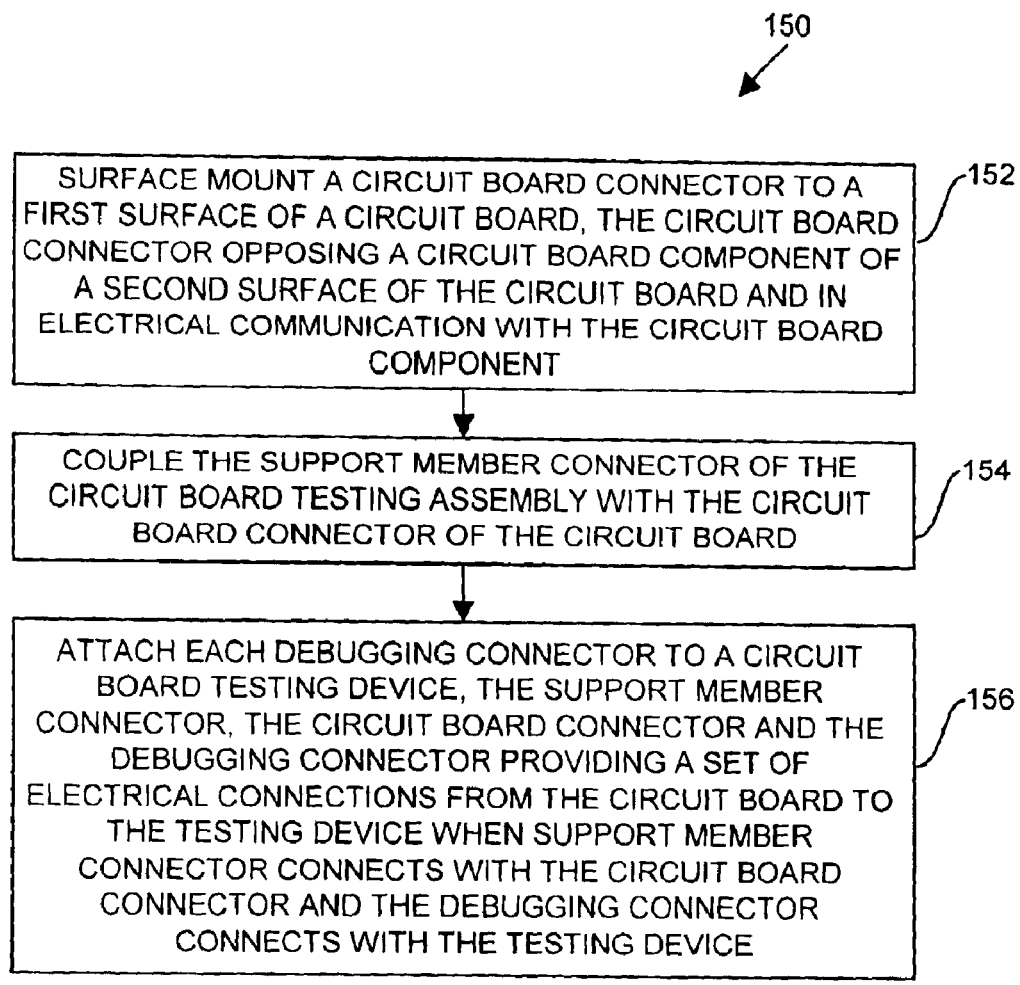
FIG. 7 illustrates a flowchart of a procedure for testing a circuit board, according to one embodiment.

FIG. 7 illustrates a flowchart for a method 150 for testing a circuit board 22 using a circuit board testing assembly 20. As described above, the circuit board testing assembly has a support member 28, at least one debugging connector 26 coupled to a first surface 32 of the support member 28, and a support member connector 30 coupled to a second surface 34 of the support member 28 and in electrical communication with the debugging connector 26.

In step 152, a user surface mounts a circuit board connector 40 to a first surface 44 of a circuit board 22, the circuit board connector 40 opposing a circuit board component 42 of a second surface 46 of the circuit board 22 and in electrical communication with the circuit board component 42. As described above, surface mounting the circuit board connector 40 to the circuit board 22 minimizes the necessity for adding through-holes or support plates to secure the circuit board connector 40 to the circuit board 22.

In step 154, the user couples or connects the support member connector 30 of the circuit board testing assembly 20 with the circuit board connector 40 of the circuit board 22. Such connection provides electrical communication among the circuit board 22, circuit board component 42 and the debugging connectors 26.

In step 156, the user attaches each debugging connector 26 to a circuit board testing device 18, the support member connector 30, the circuit board connector 40, and the debugging connector 26 providing a set of electrical connections 74 from the circuit board 22 to the testing device 18 when support member connector 30 connects with the circuit board connector 40 and the debugging connector 26 connects with the testing device 18. The set of electrical connections 74 allows the user to test or debug the circuit board and circuit board component 42.

In one arrangement, when the user couples or connects the support member connector 30 with the circuit board connector 40 of the circuit board 22, the user aligns the support member connector 30 and the circuit board connector 40 using an alignment mechanism 68. For example, the alignment mechanism 68 has a first alignment portion 70 associated with the support member connector 30 and a second alignment portion 72 associated with the circuit board connector 40. In another example, the alignment mechanism 68 has a first alignment portion 120 associated with the support member 28 and a second alignment portion 122 associated with the circuit board 22. As described above, in the case where the support member connector 30 is configured with a pin array 52 and the circuit board connector 40 is configured with a socket array 54, the alignment mechanism 68 provides for proper alignment of the pin array 52 and the socket array 54 such that pin 1 of the pin array 52 aligns with socket 1 of the socket array 54, pin 2 aligns with socket 2, etc. The alignment mechanism 68 minimizes misalignment between the pin array 52 and the sockets array 56. Such misalignment can lead to improper testing of the circuit board 22 or circuit board component 42.

In one arrangement, prior to testing the circuit board 22, the user receives the circuit board assembly 60 having a circuit board 22 coupled to a first support mount or carrier tray 110. The support mount 110 includes a first surface 126 and a second surface 128 where the first surface 44 of the circuit board and first surface 126 of the first support mount 110 defines a space between the circuit board 22 and support mount 110. In order to test the circuit board 22 in an operational state (e.g., connected to a back plane in a computer system) using the circuit board testing assembly 20, the user removes the support mount (e.g., a first support mount) 110 from the circuit board 22 and attaches a second support mount 62 to the circuit board 22. The second support mount 62 defines a second support opening 66 that allows access, by the support member connector 30 of the circuit board testing assembly 20, to the circuit board connector 40 of the circuit board 22. The second support mount 62 also allows the user to connect the circuit board assembly 60 with a back plane in a computer system, thereby allowing the user to test the circuit board 22 and circuit board component 42 as the circuit board 22 operates.

Figure 8:
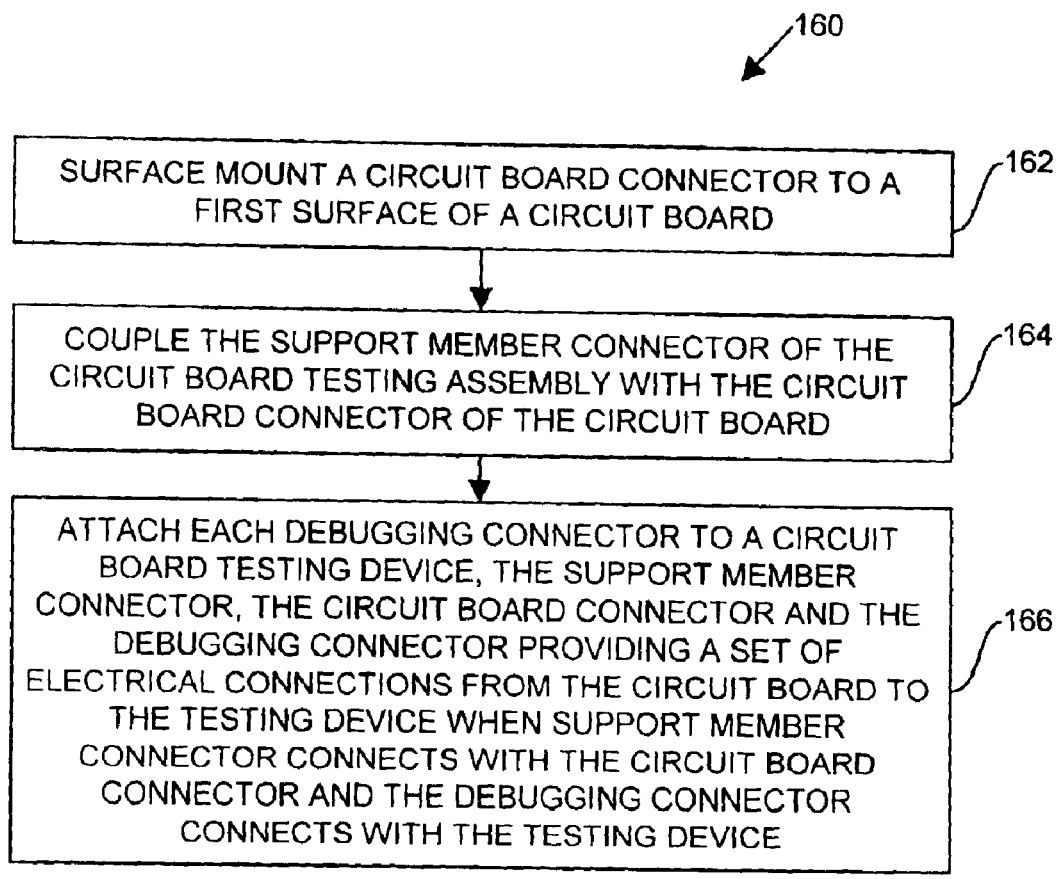
FIG. 8 illustrates a flowchart of a procedure for testing a circuit board, according to another embodiment.

FIG. 8 illustrates a flowchart for a method 160 of testing a circuit board 102 using a circuit board testing assembly 104. As described above, the circuit board testing assembly 104 has a support member 28, at least one debugging connector 26 coupled to a first surface 32 of the support member 28, a circuit board component 42 coupled to the first surface 32 of the support member 28 and in electrical communication with the at least one debugging connector 26. The circuit board testing assembly 104 also has a support member connector 30 coupled to the second surface 34 of the support member 28 and in electrical communication with the at least one debugging connector 26.

In step 162, a user surface mounts a circuit board connector 40 to a first surface 106 of a circuit board 102. The first surface 106 of the circuit board 102 is defined as the circuit board surface opposing the support member 110 (e.g., the component surface of the circuit board 102). Surface mounting the circuit board connector 40 to the circuit board 102 minimizes or prevents the need for the user or manufacturer to add through-holes or support plates to secure the circuit board connector 40 to the circuit board 102. Surface mounting the circuit board connector 40 to the circuit board 102, therefore, minimizes the real estate used by the circuit board connector 40 in mounting to the circuit board 102.

In step 164, a user couples the support member connector 30 of the circuit board testing assembly 104 with the circuit board connector 40 of the circuit board 102. Such connection provides electrical communication among the circuit board 102, circuit board component 42 and the debugging connectors 26.

In step 166, the user attaches each debugging connector 26 to a circuit board testing device 18. The support member connector 30, the circuit board connector 40, and the debugging connector 26 provide a set of electrical connections 74 from the circuit board 102 to the testing device 18 when support member connector 30 connects with the circuit board connector 40 and the debugging connector 26 connects with the testing device 18.

In one arrangement, after testing the circuit board 102, the user removes the circuit board component 42 from the first surface 32 of the support member 28 and electrically couples the circuit board component 42 to the circuit board connector 40 of the circuit board 102. For example, the circuit board component 42, in one arrangement, couples to the circuit board testing assembly 104 by way of a surface mount connection 112 using, for example, a ball grid array. To remove the circuit board component 42 from the support member 28, in such an arrangement, the user heats the surface mount connection 112 to soften or liquefy the solder that forms the connection. Once the surface mount connection 112 softens, the user removes the circuit board component 42 from the support member 28. The user then attaches the circuit board component 42 to the circuit board connector 40 located on the circuit board 102. In one arrangement, for example, the user or assembler attaches the circuit board component 42 to an interposer or adaptor between the circuit board component 42 and the circuit board connector 40, thereby allowing connection and electrical communication between the circuit board component 42 and the circuit board connector 40.

Those skilled in the art will understand that there can be many variations made to the embodiments explained above while still achieving the same objective of those embodiments and the invention in general.

For example, as described above, the circuit board connector 40 mounts to the first surface 44 of the circuit board directly opposing (e.g., directly below) the circuit board component 42. During assembly of the circuit board 22, the second surface 46 (e.g., component side) of the circuit board 22 is configured with plurality of pads and vias, where the vias extend from the second surface 46 to the first surface 44 of the circuit board 22. The circuit board component 42 secures to the pads of the second surface 46 of the circuit board 22 using surface mount technology (e.g., solder ball grid array) to form a circuit board component solder joint 48. As described, the circuit board connector 40 secures to pads on the first surface 44 of the circuit board 22, the pads electrically connected to the corresponding vias on the first surface 44 of the circuit board 22. In another arrangement, the first surface 44 of the circuit board is not configured with pads. In such an arrangement, the circuit board connector 40 secures to the vias on the first surface 44 of the circuit board 22, the vias providing an electrical connection between the circuit board connector 40 and the circuit board component.

In another example, as described above, the alignment mechanism 68 aligns the support member connector 30 with the circuit board connector 40. In another arrangement, the alignment mechanism 68 limits the amount of force applied by the support member connector 30 (e.g., having the pin array 52) on the circuit board connector 40 (e.g., having the socket array 54). By limiting the amount of force applied, the alignment mechanism 68 minimizes potential damage to the sockets array 54 as caused by the pin array 52, or damage to the pin array 52 as caused by the socket array 54 (e.g., bending or crumpling of the pins).

In another example, as described above, the support member 28 allows a manufacturer to provide traces or electrical connections 36 between the high density support member connector 30 and the debugging connectors 26. In one arrangement, the manufacturer configures the line traces and line impedances of the support member 28 to match the line impedances of the circuit board 22 under test to minimize signal reflection and distortion during a testing procedure.

Such variations are intended to be covered by the scope of this invention. As such, the foregoing description of embodiments of the invention is not intended to be limiting. Rather, any limitations to the invention are presented in the following claims.

What is claimed is:

1. A circuit board testing assembly comprising:
   a support member having a first surface and a second surface;
   at least one debugging connector coupled to the first surface of the support member, the at least one debugging connector configured to attach to a circuit board testing device; and
   a support member connector coupled to the second surface of the support member and in electrical communication with the at least one debugging connector, the support member configured to removably attach to a circuit board connector surface mounted to a first surface of a circuit board, the support member connector, the circuit board connector and the debugging connector configured to provide a set of electrical connections from the circuit board to the testing device when support member connector connects with the circuit board connector and the debugging connector connects with the testing device.

2. The circuit board testing assembly of claim 1 further comprising an alignment mechanism having a first alignment portion associated with the support member connector and a second alignment portion associated with the circuit board connector, the alignment mechanism configured to align the support member connector with the circuit board connector during an attachment procedure.

3. The circuit board testing assembly of claim 1 further comprising an alignment mechanism having a first alignment portion associated with the support member and a second alignment portion associated with the circuit board, the alignment mechanism configured to align the support member connector with the circuit board connector during an attachment procedure.

4. The circuit board testing assembly of claim 1 wherein the support member connector defines an opening configured to allow connection of a decoupling capacitor to the support member.

5. The circuit board testing assembly of claim 1 wherein the support member connector comprises a pin base having a plurality of pins and wherein the circuit board connector comprises a socket base defining a plurality of sockets, the plurality of sockets corresponding to the plurality of pins.

6. The circuit board testing assembly of claim 1 wherein the support member connector comprises a high density connector providing multiple electrical connection locations between the debugging connector and the circuit board.

7. The circuit board testing assembly of claim 1 wherein the circuit board connector comprises a high density connector providing multiple electrical connection locations between the debugging connector and the circuit board.

8. The circuit board testing assembly of claim 1 wherein the support member connector comprises a surface mountable support member connector and the support member comprises a circuit board material, the surface mountable support member connector surface mounted to the support member.

9. The circuit board testing assembly of claim 1 wherein the at least one debugging connector comprises a MICTOR connector.

10. The circuit board testing assembly of claim 1 wherein the support member is configured to removably attach to a circuit board connector surface mounted to a first surface of a circuit board, a plane defined by the support member substantially parallel to a plane defined by the circuit board.

11. A circuit board assembly comprising:
   a circuit board having a first surface and a second surface;
   a circuit board connector, the circuit board connector surface mounted to the first surface of the circuit board;
   a circuit board component coupled to the second surface of the circuit board and in electrical communication with the circuit board connector; and
   a circuit board testing assembly having:
      a support member having a first surface and a second surface;
      at least one debugging connector coupled to the first surface of the support member, the at least one debugging connector configured to attach to a circuit board testing device; and
      a support member connector coupled to the second surface of the support member and in electrical communication with the at least one debugging connector, the support member configured to removably attach to the circuit board connector, the support member connector, the circuit board connector and the debugging connector configured to provide a set of electrical connections from the circuit board to the testing device when support member connector connects with the circuit board connector and the debugging connector connects with the testing device.

12. The circuit board assembly of claim 11 further comprising an alignment mechanism having a first alignment portion associated with the support member connector and a second alignment portion associated with the circuit board connector, the alignment mechanism configured to align the support member connector with the circuit board connector during an attachment procedure.

13. The circuit board assembly of claim 11 further comprising an alignment mechanism having a first alignment portion associated with support member and a second alignment portion associated with the circuit board, the alignment mechanism configured to align the support member connector with the circuit board connector during an attachment procedure.

14. The circuit board assembly of claim 11 wherein the support member connector defines a first opening configured to allow connection of a decoupling capacitor to the support member.

15. The circuit board assembly of claim 11 wherein the circuit board connector defines a second opening configured to allow connection of a decoupling capacitor to the circuit board.

16. The circuit board assembly of claim 11 further comprising a support mount substantially parallel to and coupled with the circuit board, the support mount having a first surface and a second surface, the first surface of the circuit board and first surface of the support mount defining a space between the circuit board and support mount, the support mount defining a support mount opening to allow access, by the support member connector of the circuit board testing assembly, to the circuit board connector of the circuit board.

17. The circuit board assembly of claim 11 wherein the support member connector comprises a pin base having a plurality of pins and wherein the circuit board connector comprises a socket base defining a plurality of sockets, the plurality of sockets corresponding to the plurality of pins.

18. The circuit board assembly of claim 11 wherein the support member connector comprises a high density connector providing multiple electrical connection locations between the debugging connector and the circuit board.

19. The circuit board assembly of claim 11 wherein the circuit board connector comprises a high density connector providing multiple electrical connection locations between the debugging connector and the circuit board.

20. The circuit board assembly of claim 11 wherein the support member connector comprises a surface mountable support member connector and the support member comprises a circuit board material, the surface mountable support member connector surface mounted to the support member.

21. The circuit board assembly of claim 11 wherein the at least one debugging connector comprise a MICTOR connector.

22. The circuit board assembly of claim 11 wherein the support member is configured to removably attach to a circuit board connector surface mounted to a first surface of a circuit board, a plane defined by the support member substantially parallel to a plane defined by the circuit board.

23. The circuit board assembly of claim 11 wherein:
the second surface of the circuit board opposes the first surface of the circuit board; and
the circuit board component coupled to the second surface of the circuit board and in electrical communication with the circuit board connector substantially opposes the circuit board connector surface mounted to the first surface of the circuit board.

24. A circuit board testing system comprising:
a circuit board testing device;
a circuit board having a first surface and a second surface;
a circuit board connector, the circuit board connector surface mounted to the first surface of the circuit board;
a circuit board component coupled to the second surface of the circuit board and in electrical communication with the circuit board connector; and
a circuit board testing assembly having:
a support member having a first surface and a second surface;
at least one debugging connector coupled to the first surface of the support member, the at least one debugging connector configured to attach to a circuit board testing device; and
a support member connector coupled to the second surface of the support member and in electrical communication with the at least one debugging connector, the support member configured to removably attach to the circuit board connector, the support member connector, the circuit board connector and the debugging connector configured to provide a set of electrical connections from the circuit board to the testing device when support member connector connects with the circuit board connector and the debugging connector connects with the testing device.

25. The circuit board testing system of claim 24 wherein the at least one debugging connector comprises a MICTOR connector.

26. The circuit board testing system of claim 24 wherein the support member is configured to removably attach to a circuit board connector surface mounted to a first surface of a circuit board, a plane defined by the support member substantially parallel to a plane defined by the circuit board.

27. The circuit board testing system of claim 24 wherein:
the second surface of the circuit board opposes the first surface of the circuit board; and
the circuit board component coupled to the second surface of the circuit board and in electrical communication with the circuit board connector substantially opposes the circuit board connector surface mounted to the first surface of the circuit board.

* * * * *